United States Patent
Todd et al.

(10) Patent No.: US 7,117,930 B2
(45) Date of Patent: Oct. 10, 2006

(54) HEAT PIPE FIN STACK WITH EXTRUDED BASE

(75) Inventors: John J. Todd, Chester Springs, PA (US); David R. Longsderff, Columbia, PA (US); Jerome E. Toth, Hatboro, PA (US)

(73) Assignee: Thermal Corp., Wilmington, DE (US)

( * ) Notice: Subject to any disclaimer, the term of this patent is extended or adjusted under 35 U.S.C. 154(b) by 0 days.

(21) Appl. No.: 10/983,428

(22) Filed: Nov. 8, 2004

(65) Prior Publication Data

US 2005/0103473 A1 May 19, 2005

Related U.S. Application Data

(63) Continuation of application No. 10/457,309, filed on Jun. 9, 2003, now Pat. No. 6,830,098.

(60) Provisional application No. 60/388,781, filed on Jun. 14, 2002.

(51) Int. Cl.
F28D 15/04 (2006.01)
(52) U.S. Cl. .................. 165/104.21; 165/80.4
(58) Field of Classification Search ........... 165/104.33, 165/104.26, 104.21, 185, 80.4; 361/699, 361/700, 697; 257/714–716; 174/15.2
See application file for complete search history.

(56) References Cited

U.S. PATENT DOCUMENTS

| | | | |
|---|---|---|---|
| 5,625,229 A | 4/1997 | Kojima et al. | |
| 5,647,429 A | 7/1997 | Oktay et al. | |
| 5,793,611 A * | 8/1998 | Nakazato et al. | 361/704 |
| 5,826,645 A | 10/1998 | Meyer, IV et al. | |
| 5,901,040 A * | 5/1999 | Cromwell et al. | 361/704 |
| 6,055,157 A | 4/2000 | Bartilson | |
| 6,061,235 A | 5/2000 | Cromwell et al. | |
| 6,102,110 A * | 8/2000 | Julien et al. | 165/104.33 |
| 6,134,783 A | 10/2000 | Bargman et al. | |
| 6,163,073 A * | 12/2000 | Patel | 257/712 |
| 6,169,660 B1 | 1/2001 | Sarraf et al. | |
| 6,181,556 B1 | 1/2001 | Allman | |
| 6,189,601 B1 * | 2/2001 | Goodman et al. | 165/80.3 |
| 6,313,992 B1 | 11/2001 | Hildebrandt | |
| 6,330,745 B1 | 12/2001 | Cromwell et al. | |
| 6,367,543 B1 | 4/2002 | Calaman et al. | |
| 6,381,135 B1 | 4/2002 | Prasher et al. | |
| 6,382,309 B1 | 5/2002 | Kroliczek et al. | |
| 6,388,882 B1 | 5/2002 | Hoover et al. | |
| 6,389,696 B1 | 5/2002 | Heil et al. | |
| 6,394,175 B1 * | 5/2002 | Chen et al. | 165/80.3 |
| 6,408,935 B1 | 6/2002 | DeHoff et al. | |

(Continued)

FOREIGN PATENT DOCUMENTS

JP 9-331177 * 10/1995 ............ 165/104.33

(Continued)

*Primary Examiner*—Teresa J. Walberg
(74) *Attorney, Agent, or Firm*—Duane Morris LLP

(57) ABSTRACT

A heat sink has a base plate to be clamped against a heat source and one or more heat pipes containing a phase change fluid. Each heat pipe has an elongated tubular evaporator fitted in a channel in the base plate, and a columnar condenser part perpendicular to the base plate forming a structural column for air heat exchange fins. The channel in the base plate is parallel to an edge. An additional channel or ridge is provided, also parallel to the edge, for receiving a clamp or spring clip to urge the base plate against the heat source. The base plate is inexpensively extruded with the parallel channels, ridges, etc., extending across the width of the base plate parallel to the edge. The heat sink has a minimum number of inexpensive parts yet is highly thermally efficient.

22 Claims, 3 Drawing Sheets

U.S. PATENT DOCUMENTS

| | | |
|---|---|---|
| 6,408,941 B1 | 6/2002 | Zuo |
| 6,430,024 B1 | 8/2002 | Gernert |
| 6,437,437 B1 | 8/2002 | Zuo et al. |
| 6,446,706 B1 | 9/2002 | Rosenfeld et al. |
| 6,450,250 B1 * | 9/2002 | Guerrero ............... 165/104.33 |
| 6,474,074 B1 | 11/2002 | Ghoshal |
| 6,542,364 B1 * | 4/2003 | Lai et al. ................... 361/697 |
| 6,595,269 B1 * | 7/2003 | Mitchell ...................... 165/86 |
| 6,625,021 B1 * | 9/2003 | Lofland et al. ............. 361/697 |
| 6,745,824 B1 * | 6/2004 | Lee et al. .............. 165/104.14 |
| 6,779,595 B1 * | 8/2004 | Chiang ................... 165/104.33 |
| 6,785,140 B1 * | 8/2004 | Artman et al. .............. 361/709 |

FOREIGN PATENT DOCUMENTS

| | | | | |
|---|---|---|---|---|
| JP | 11-351769 | * | 12/1999 | ............ 165/104.33 |
| TW | 471657 | * | 1/1991 | ............ 165/104.33 |

* cited by examiner

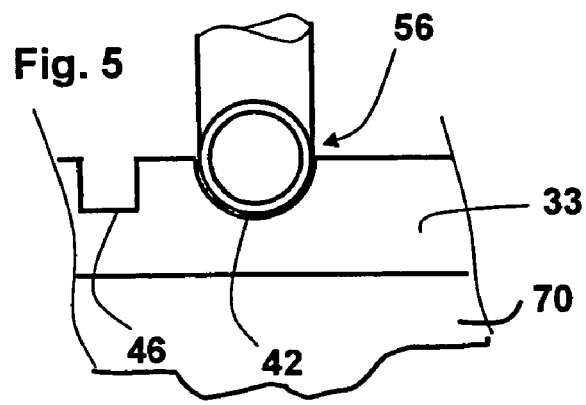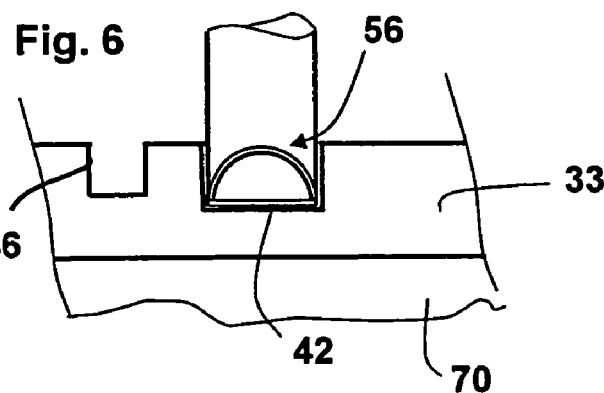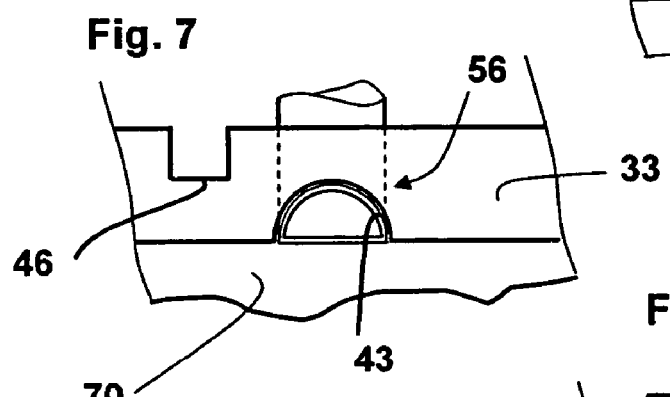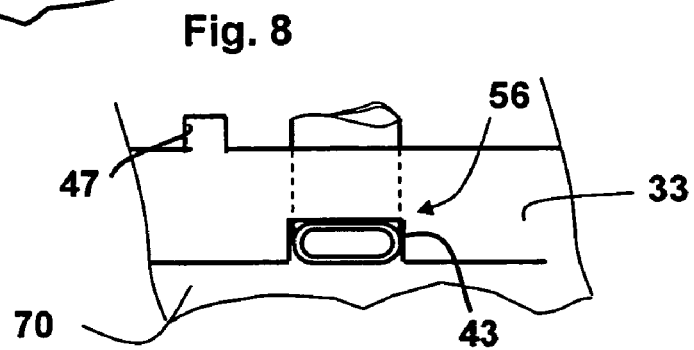

HEAT PIPE FIN STACK WITH EXTRUDED BASE

CROSS REFERENCE TO RELATED APPLICATION

This application is a continuationl application of U.S. application Ser. No. 10/457,309, filed on Jun. 9, 2003, now U.S. Pat. No. 6,830,098 which itself claimed the benefit of Provisional Patent Application Ser. No. 60/388,781, filed Jun. 14, 2002.

FIELD OF THE INVENTION

The invention relates to the structure of heat exchangers, and in particular a heat dissipation tower arrangement or heat sink for transferring heat energy collected at a conductive base in contact with a thermal source such as an integrated circuit package. The heat is transferred via heat pipes carrying a phase-change fluid, into a set of fins in contact with the ambient air. The heat pipe tubes fit in complementary channels in the base, which extend parallel to one another and parallel to an edge of the base. The tubes are diverted upwardly to serve as columnar supports of the fins. This structure is simple and inexpensive in that the base can be a cut section of an extruded form to which the heat pipes and fins are simply assembled. Yet the structure has a substantial heat dissipation capacity.

BACKGROUND OF THE INVENTION

Certain semiconductor devices in electrical and electronic circuits, such as large scale integrated circuits, voltage regulators, current switching devices, high current drivers and other similar devices, generate heat that is deleterious to their operation and must be dissipated. An individual semiconductor junction may be subject to thermal runaway current conduction leading to further heating and damage. In large scale digital integrated circuits, operation at or above the maximum rated temperature can result in spurious switching operations and functional failure.

In a highly integrated semiconductor device such as a computer processor, a single semiconductor switching transistor may conduct little concurrent on its own, but is densely mounted with many other transistors. A single integrated device may generate heat energy of a hundred Watts or more. Supplemental cooling arrangements may be needed in addition to convective cooling by heat driven circulation of ambient air, conduction of heat through circuit lands and the like, for maintaining operational temperatures within design ranges. For this purpose, thermally conductive heat sink devices, normally of cast or sheet metal and having a substantial surface area exposed to the air, are mounted on a base that is clamped to bear physically against the heat generating circuit element.

A large-scale integrated circuit such as a computer processor or similar device typically is mounted removably in a receptacle that is soldered to a printed circuit board. The receptacle has inward-facing resilient contacts for conductively coupling to contacts on the circuit package, which package may be several cm on a side. The receptacle or auxiliary structures associated with the printed circuit board carry spring-clip clamping mechanisms that engage over part of the heat sink, rested atop the circuit package. The clamping mechanism physically presses a heat sink against the circuit package when mounted. The heat sink typically comprises a base block that is relatively thick, integrally cast with an array of thin fins functioning as a heat exchanger to release heat into the ambient air. The array of fins and/or the base has structure to cooperate with the clamping mechanism, and can also provide a point of attachment for a fan for forcing a flow of air over the fins.

Heat energy diffuses from the active circuit elements into the circuit substrate and into the circuit packaging structure, which comprises thermally conductive plastic or ceramic. The heat energy diffuses by conductive contact into the base of the heat sink, and then diffuses through the integral or thermally conductively attached structures of the heat sink to the surfaces at which air contact heat exchange convection carries the heat away. The array of fins typically is cast integrally with the heat sink base, but also can be thermally conductively attached in contact with the base. The function of the fins is to present a relatively large surface area, preferably within a relatively small total volume, for efficient thermal energy release. The electrically powered fan, mounted on the heat exchanger by screws or clamps, forces air over the heat exchanger fins and may improve thermal transfer. However, the fan also dissipates a certain amount of heat into the air. The heat sink spreads out the heat energy from the source, primarily the integrated circuit, into the cabinet or housing volume of the device. Another fan may be provided to circulate air between the housing and the ambient room air.

Integrated circuit devices are available according to more or less demanding temperature specifications. Devices that have a relatively wider temperature range are more expensive. Standard commercial computer processor components, for example, may be rated up to 70° C. (about 160° F.). The most durable military application devices may be rated up 125° C. (about 260° F.). These devices are sometimes required to operate in ambient air temperature conditions ranging from −40 to +55° C. (about −40 to +130° F.).

Movement of thermal energy from an integrated circuit or other localized heat source, toward a remote area or toward a structure that carries the heat away, occurs from one or more of thermal conduction, convection and radiation. Conduction of heat energy requires contact between thermally conductive masses and proceeds at a rate that depends in part on the difference in temperature between the masses. Convection involves conduction between a heated body and adjacent heat transfer fluid (gas or liquid), typically air, involves differences in fluid density due to differences in fluid temperature, and is substantially affected by forced air currents. Radiation also dissipates heat, but its contribution is normally small at the temperature ranges of interest.

Heat transfer arrangements can involve passing a current of cooler air or other heat transfer fluid over a hotter surface to be cooled. A captive heat transfer fluid can be provided in closed volume and arranged to circulate. The fluid is heated by a source of heat energy that is in heat transfer relationship with one part of the closed volume. A heat sink is arranged in heat transfer relationship with another part of the closed volume, releasing heat (provided that the heat exchange medium, such as air, is kept cooler than the heat sink), and cooling the fluid. The heat transfer fluid advantageously undergoes cyclic changes of phase. Each change of phase either stores or releases a quantity of heat energy due to the latent thermal energy involved in the phase change itself.

In this way, a liquid phase change heat transfer fluid can be evaporated (vaporized) into gas at the heat source and condensed again into liquid at the heat sink. Different techniques can be used to return the condensed liquid from the condenser to the evaporator, which need not be powered by outside energy sources. A return path is possible, for example, over a gravity flow path in a thermo-siphon arrangement. In a heat pipe arrangement, a return path for the condensed liquid can be provided by lining the vessel confining the heat transfer fluid with a wicking material that supports capillary flow, such as a sintered particulate or powder lining. The capillary flow is driven substantially by surface tension and can proceed regardless of orientation and gravity.

Assuming that the heat transfer fluid is confined in an integral metal vessel, some thermal conduction from the heat source to the sink can occur through the vessel walls. It is desirable on grounds of efficiency to separate the evaporator and condenser sections by a distance or otherwise to interpose a thermal barrier that permits maintenance of a temperature difference. Nevertheless, phase change heat exchange circuits as described can operate with a very modest temperature difference between the source and the sink and can efficiently move heat energy to assist in heat dissipation.

There are a number of design considerations for thermal transfer arrangements such as heat pipes. In addition to the ability to handle the necessary flow of thermal energy to keep the heat source within desired temperature limits, the evaporator and the condenser should have a good heat transfer coupling with the heat source and sink, respectively. The thermal transfer characteristics of the heat pipe structures, the various dimensions and quantities, etc. need to operate over the range of expected temperatures. Preferably the device is compact and does not interfere unduly with necessary access to structures associated with the heat source and sink.

A number of heat pipe arrangements according to the foregoing general description are available from Thermacore International, Inc., Lancaster, Pa., and are disclosed in US patents assigned to their licensor, Thermal Corp., Georgetown, Del. In a heat pipe, the liquid and vapor phases of the heat transfer medium reach equilibrium in the absence of temperature differences and remain substantially stagnant. When heat energy is added at the evaporator, a temperature difference arises. Vaporization of the heat transfer medium at the evaporator leads to increased local vapor pressure in that area. The vapor diffuses through the envelope of the heat pipe, and a portion arrives at the condenser. The condenser is at a slightly lower temperature. As the vapor is cooled and condenses, releasing the latent heat energy of vaporization at the area of the condenser, heat energy is transferred from the heat transfer medium to the heat pipe envelope, where air heat exchange fins remove the heat energy.

The condensed liquid phase heat transfer medium flows back to the evaporator due to capillary forces developed in the wick structure, and the cycle can repeat. Where there is a positive temperature difference between the evaporator (e.g., warmed by an electrical circuit element) and the condenser (e.g., cooled by convection, forced air, contact with a thermal sink, etc.) the cycle can continue indefinitely, moving heat energy. The technique is operative at low thermal gradients. The operation is passive in that it can be driven wholly by the heat energy that it transfers.

U.S. Pat. No. 6,381,135—Prasher; U.S. Pat. No. 6,389, 696—Heil; and U.S. Pat. No. 6,382,309—Kroliczek teach additional heat dissipation apparatus intended for cooling integrated circuit devices and the like, as described. These references are hereby incorporated for their teachings of heat pipe or thermal siphon devices.

A stacked-fin heat sink device for a large scale integrated circuit or processor chip package is disclosed in U.S. Pat. No. 6,061,235—Cromwell et al. In that device, a mounting fixture is attached to the motherboard or other circuit card to surround the processor, and the fixture receives a spring biased mounting that presses a thermally conductive base plate into mechanical and thermally conductive contact with the processor package. A heat pipe is contained in a cylindrical vessel disposed centrally on and longitudinally extending perpendicular to the thermally conductive plate. A plurality of heat transfer fins are disposed parallel to one another and perpendicular to the extension of the cylindrical vessel. In this patent, which is hereby incorporated in this disclosure, the thermally conductive plate at the bottom end of the heat pipe vessel can function as the evaporator, having a slightly higher temperature than the finned sidewalls of the vessel remote from the bottom, which maintain a lower temperature and can function as the condenser. In the standing configuration shown, gravity can power the return path. In other orientations, a wicking material can be provided so that capillary action drives the return path.

The spaced air-contact fins in Cromwell need to be assembled with the heat pipe tube. Whereas the fins are rectangular and the heat pipe is a cylinder, there are issues respecting vertical, horizontal and rotational alignment of the plates to the one another, and attachment to the cylinder in good thermally conductive contact. These problems appear to have been addressed by affixing the fins to opposed side plates, thus requiring additional parts and assembly while affecting the extent of available air circulation. Air circulation characteristics and heat transfer characteristics are also affected by the relative size of the heat pipe and the fins. It would be advantageous if the structure of such a heat sink could be minimized, preferably such that the heat pipe provide substantially all the structural support needed for the fins.

A mounting base plate arrangement has certain potentially useful aspects in connection with a heat transfer device. A plate is useful to present a large surface area for contact with a heat source having a planar surface, such as a processor or VLSI circuit. The rate of heat transfer by conduction is partly a function of the area and intimacy of contact. The plate can have a reasonably substantial thickness, which provides a thermal storage capacity and leads to rapid heat transfer throughout the material of the plate. Apart from these benefits, the drawbacks include the complications associated with mounting the plate to the heat source, and the need to mount the heat pipe vessel to the base plate and to mount the fins. These needs are met in part by providing structures on the base plate. The structures can include a clasp part that is complementary with a spring clip for affixing the base plate to the heat sources. The structures can also include structures that are complementary with the external structure of the heat pipe vessel, which is capable of various shapes. The structure of the base plate can even provide one or more walls that are assembled to close the heat pipe vessel.

However there is a strong interest in controlling the complication and expense of heat sinks. Heat sinks are preferably made in a manner that maximizes thermal efficiency by providing good contact between the heat source, the heat pipe and the fins. The optimal structure should have very inexpensive parts, mounted by very inexpensive assembly steps, but should provide good thermal efficiency.

It would be advantageous to reduce the complexity of a heat sink containing a heat pipe, to the minimum necessary to achieve the objectives of efficient heat transfer and the structural connections that are involved.

SUMMARY OF THE INVENTION

It is an object of the invention concurrently to improve ease of manufacture and to reduce the expense of a heat sink device, while providing good structural integrity and thermal energy transfer efficiency.

It is an object to employ at least one and preferably a plurality of heat pipe vessels as structural support elements that function to mount an air-exchange heat transfer fins on a source-contact heat transfer base.

It is another object to minimize the number and complexity of parts needed to construct a heat dissipation device carried on a base plate having structures for attachment to a heat source and for receiving a clamping fixture, and to enable the use of a base plated that requires no supplemental drilling, bending or similar shaping steps.

It is still another object to provide a heat sink on a base plate that is capable of certain variations in the respective location of its parts.

These and other objects are met in a heat transfer device such as a heat sink, carried on a base plate having parallel depressions extending across the full extension of the base plate, for receiving heat pipe tubes in thermal engagement with the base plate, and also for receiving spring clip clamping fixtures for attaching the base plate to a heat source. The depressions for the heat pipe tubes are subject to variations that are discussed herein. By providing mounting structures on the base plate that are substantially met by shaped grooves or depressions extending across the base plate, the base plate can be simply extruded in its final shape, no machining or drilling steps being required.

The heat pipe tubes have a working fluid in a vessel with a wicking material between an evaporator and condenser. Preferably two parallel dual heat pipe tubes are provided, each having a U-shape wherein the bottom of the U-shape fits in a corresponding depression across the base plate and the legs of the U-shape function as standing columns that support air heat exchange fins.

According to the respective embodiments, the depressions for the heat pipes can be squared or rounded in cross section. The depressions for the heat pipes and also the structures for the spring clips, can exclusively involve elongated channel shapes across the base plate, or can include raised ridges.

The legs of one or more U-shaped tubular heat pipes form the structural columns that carry a stack of air heat exchange fins. These legs can be spaced by a distance less than the extension of the base plate, such that the legs are bent upwardly from the channels formed in the base plate. The legs alternatively can be spaced by a distance greater than the width of the base plate, such that the legs are bent upwardly at a distance on either side from the base plate. In this arrangement, the bottom of the U-shape of the heat pipe tubes can be on either side of the baseplate.

The device as thus configured is easily and inexpensively manufactured. The heat pipes can be charged and sealed before assembly or afterwards, because the ends of the U-shapes remain accessible. Although not excluded, no supplemental fasteners are needed to arrange and support the assembled parts, all necessary structural interconnections being enabled by the shape of the base plate and the associated heat pipe tube and spring clips. The base plate can be shaped as a rectilinear monolithic extrusion having parallel oriented channels on one or both sides, which are cut or extruded, for receiving the bottoms of U-shaped heat pipe tubes. Preferably the spring clips or the like for attaching the base plate to a computer processor or VLSI chip or other heat source engage with additional channels arranged to straddle the heap pipe tube channels, although a raised ridge is also possible.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein:

FIGS. 5 through 8 are partially sectional elevation views illustrating certain variations in the shape and placement of base plate channels and ridges according to the invention.

DETAILED DESCRIPTION OF THE PREFERRED EMBODIMENTS

Figure 1:
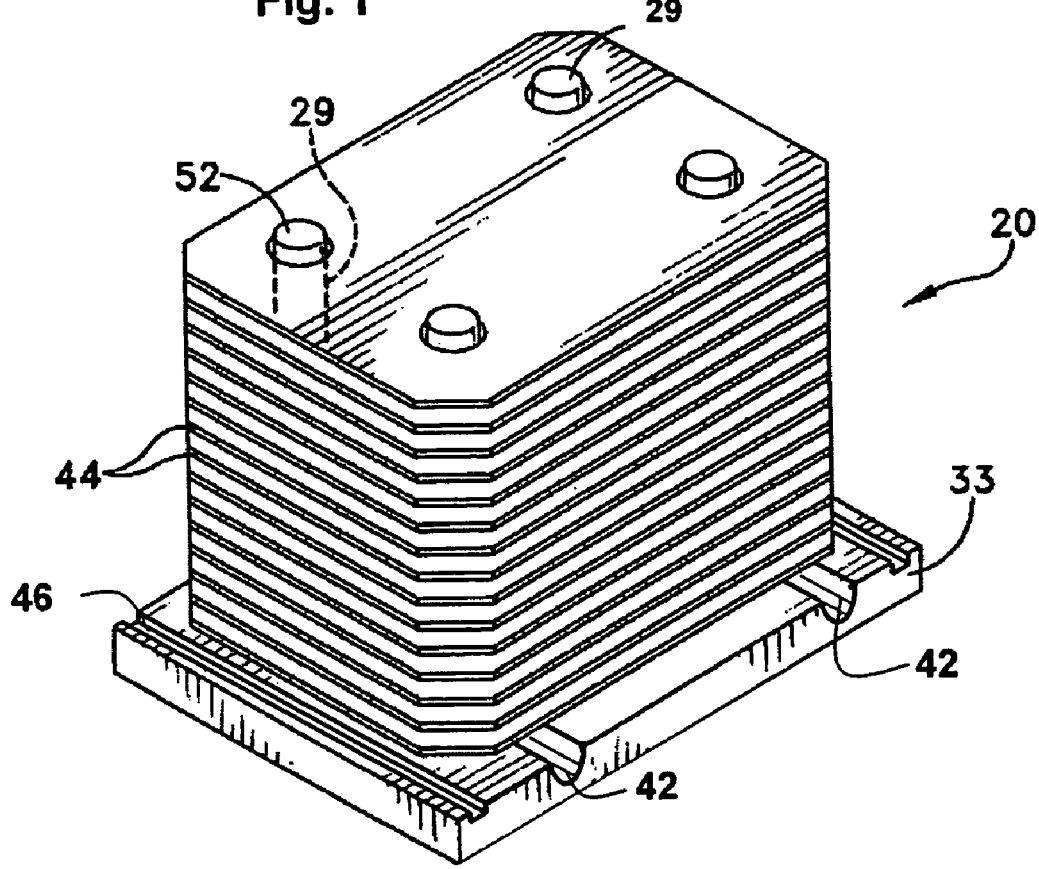
FIG. 1 is a perspective view of a heat dissipation tower or heat sink for circuit devices according to an embodiment of the invention having two dual heat pipes.

This description of preferred embodiments is intended to be read in connection with the accompanying drawings, together forming the description of the invention and illustrating certain nonlimiting examples. The drawing figures are not necessarily to scale and certain features are represented in schematic form in the interest of clarity and conciseness.

Spatial and relative terms denoting an overall orientation, such as "horizontal" "vertical," "up," "down," "top" and "bottom" as well as their derivatives (e.g., "horizontally," "downwardly," "upwardly," etc.) are intended to refer to the orientation as then described or as shown in the drawing figure under discussion. These terms are used for convenience of description and are not intended to require a particular orientation unless that is clear in the context.

Likewise, internally relative terms such as "inwardly" versus "outwardly," "longitudinal" versus "lateral" and the like are to be interpreted relative to one another or relative to an axis of elongation, rotation, assembly or the like, as appropriate to the description.

Terms stating relationships of attachment, coupling and the like, such as "connected" and "interconnected," refer to a relationship wherein the structures can be attached, coupled, connected (etc.) directly or indirectly through intervening structures. Such attachments, couplings and the like can be movable or rigid attachments, unless the description indicates otherwise. Where elements are "operatively" connected, attached, or coupled, that connection, attachment or coupling is intended to denote a connection or the like that allows the pertinent structures to operate as stated, by virtue of such relationship.

Insofar as the description and claims recite means-plus-function clauses or elements are defined by their function, those elements are intended to encompass the structures described, suggested, or obvious in view of the written description and/or drawings for performing the recited function.

A heat transfer device or heat sink 20 as shown in FIG. 1 includes two dual condenser heat pipes 29 carried on a base plate 33. Each of the heat pipes 29 generally comprises a hollow tube forming a closed envelope or volume in which a heat transfer fluid is disposed. The heat pipes preferably are lined with a wicking material that distributes the liquid phase of the heat transfer fluid within the envelope.

Each of the heat pipes 29, two being shown in FIG. 1, is generally U-shaped. The standing legs 52 of each tube form structural columns that support a stacked array of fins 44. The bottom portions 56 of the U-shape (see FIG. 3) are arranged to fit in elongated channels 42 in base plate 33 that is, each of which is formed in a general U-shape having standing legs 52.

Figure 2:
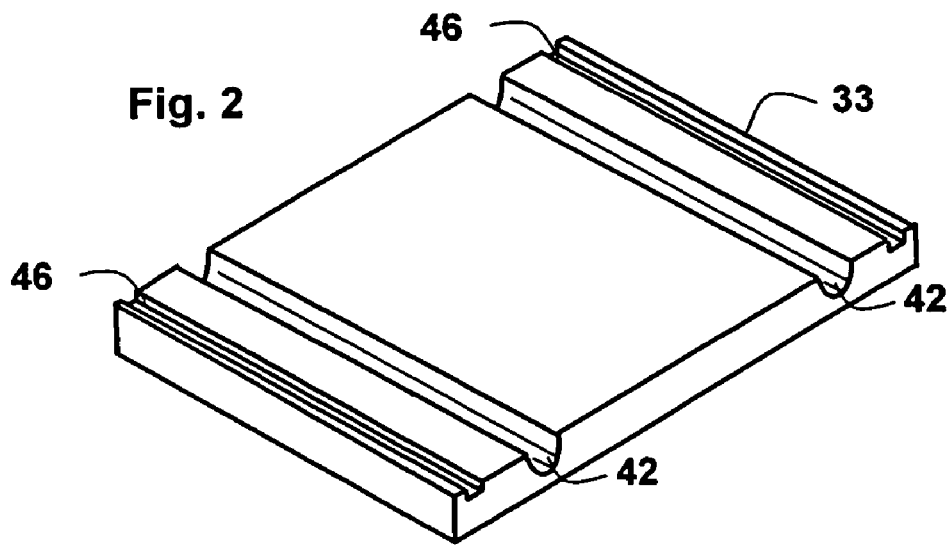
FIG. 2 is a perspective view showing the base plate part of the device according to one embodiment

FIG. 2 shows the base plate 33 separately. The base plate 33 is preferably a monolithic or integral slab of material with elongated channels 42 for affixing the heat pipes 29. The channels 42 in this embodiment are parallel to the ends of the base plate 33 and spaced inwardly from the ends, this space being occupied by elongated ridges or channels 46, which provide a point at which the base plate 33 can be engaged by a clamp or the like, discussed below with respect to FIG. 4.

In FIG. 2, it is shown that the channel and ridge configurations on base plate 33 are all parallel. By virtue of this structure, base plate 33 is very easily and inexpensively produced. Base plate 33 can be monolithic metal, for example aluminum, or another material such as conductive plastic, extruded in the direction of elongation of channels 42, 46 and simply cut to length along a line perpendicular to the direction of extrusion.

It is also possible to produce the base plate in other ways, for example by cutting the elongated channels and contours from a larger solid slab. However an important advantage of the structure as shown is that it can be simply extruded at very minimal cost.

Figure 3:
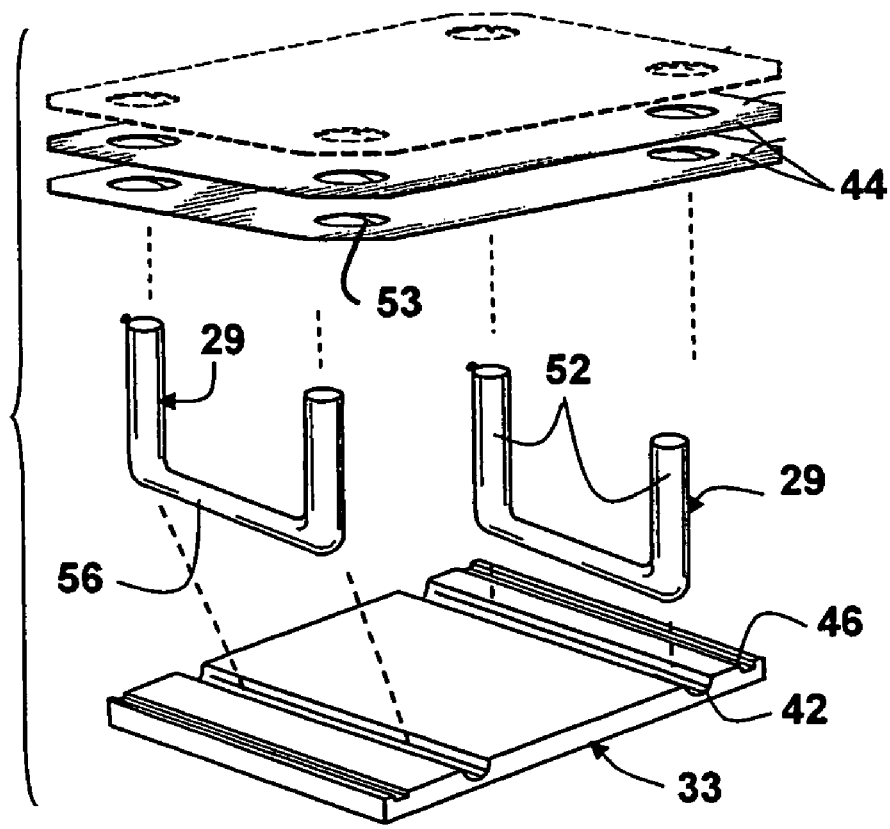
FIG. 3 is an exploded perspective view illustrating assembly of the respective parts.

The heat sink device is assembled as shown in FIG. 3. The heat pipes 29 are arranged such that the standing legs 52 of their U-shaped forms are disposed perpendicular to the plane of the base plate 33. The bottom segments 56 of the U-shaped heat pipes are fit into the elongated channels 42, which in the embodiment shown in FIG. 2 are on the upper facing surface of the base plate 33.

The air heat exchange fins 44 are mounted over the standing column legs 52 of the heat pipes 29. Preferably, the fins 44 are mounted by press fitting the fins 44 at their holes 53, over the standing column parts 52 of heat pipes 29. The respective parts can be permanently affixed, for example, by soldering, adhesive or the like. Alternatively, the heat pipes 29 can be soldered or adhered to the base plate 33, leaving freedom to displace the fins 44 on the column legs 52 of heat pipes 29, if necessary to provide clearance with some other part (not shown).

Figure 4:
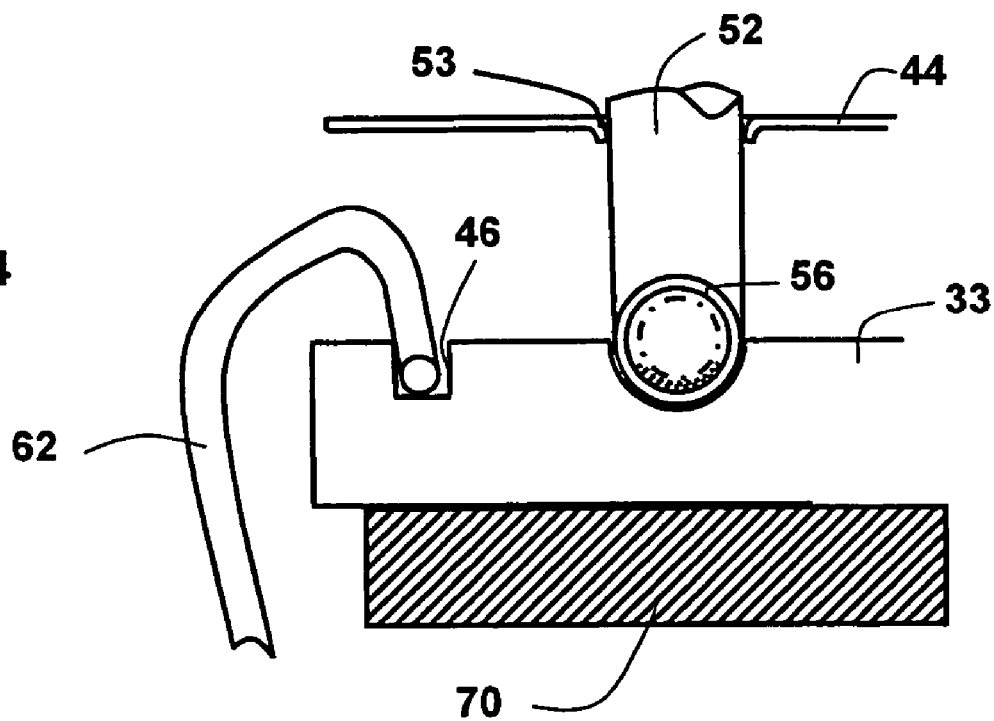
FIG. 4 is a partially sectional elevation view showing the heat sink device installed on a circuit element to be cooled.

Referring to FIG. 4, in a preferred arrangement the fins 44 are arranged with openings 53 that are stamped or similarly formed to have a hub or collar portion of the fin 44, extending for a short longitudinal distance along the leg 52 of the heat pipe. This short collar improves structural rigidity of the stacked fins and also provides for good thermally conductive contact between the standing leg 52 and the fin 44.

The bottom part 56 of the U-shaped heat pipe vessel 29 is placed in relatively closer thermally conductive relation with the heat source 70 (shown in FIG. 4), such as an integrated circuit, than are the standing legs 52. Accordingly, the bottom part 56 of the U-shaped heat pipe 29 becomes slightly warmer due to heating from the source 70 as conductively coupled to the bottom part 56 through base plate 33. The bottom part 56 functions as an evaporator and vaporizes the liquid phase of a heat transfer medium therein.

The vaporized medium diffuses through the envelope that includes bottom part 56 and standing legs 52. The standing legs are slightly cooler due to dissipation of heat energy into fins 44 and by convection into the ambient air. Therefore, the leg portions 52 function as condensers, where the heat transfer medium is condensed from the gaseous phase to the liquid phase. With changes of phase from liquid to gas and from gas to liquid, the latent energy of vaporization is stored in the heat transfer medium. Due to this cyclic storage and release of latent heat energy, the coolant carries substantially more heat energy from base plate 33 and source 70 to the fins 44, than would be possible in the case of flowing heat transfer medium that does not change phase. The gas pressure conditions in the heat pipe are established by partially evacuating the heat pipe when charging the heat pipe with liquid heat transfer medium. An equilibrium is established when the heat pipe is then sealed. The charging and sealing can be accomplished by providing a small passage at the top end of one of the standing columns 52, which can be pinched off or plugged with solder or adhesive after charging.

Referring to FIG. 4, the base plate 33 is clamped in direct thermally conductive contact with the integrated circuit package 70 (or other heat source to be cooled). For this purpose, a spring clip 62 or similar clamp mechanism is provided and is arranged to engage with a complementary channel 46 on the base plate. The channel 46, like the channel 42 for the bottom part of the heat pipe, is a fully elongated channel that can be formed during extrusion. Channel 46, like channel 42, extends across the full width of the base plate 33.

The spring clip 62 or similar clamp mechanism can be attached in conventional manner to the circuit board (not shown), for example at a surface mounted receptacle for the integrated circuit package 70. Various forms of similar clamp mechanisms are possible, in the form of bale clips, pivoting clasps and springs.

FIGS. 5–7 illustrate some alternative complementary arrangements for the cross sectional shape of the bottom part 56 of the heat pipe 29 and the channel 42 in the base plate 33. These shapes each have benefits and drawbacks. FIGS. 5–7 also show possible variations in the shape of the channel or ridge 46 that is engaged by the clamping mechanism 62 (shown in FIG. 4).

In FIG. 7, the evaporator or bottom part 56 of the heat pipe has a round cross section, the bottom part being a cylindrical hollow tube containing a heat transfer medium and being lined with a wicking material (not shown in FIG. 7). A benefit of this arrangement is that up to the centerline of the heat pipe tube 56, the semi-cylindrical shape of the channel 42 in the base plate 33 is fully complementary with the outside shape of the heat pipe tube 56. This full surface contact provides for good heat conduction from the base plate 33 to the heat pipe tube 56 and the heat transfer medium therein.

A drawback of the cylindrical shape in FIG. 7 is that there is some tendency for the heat pipe tube 56 to rotate prior to permanent affixation. If the standing legs 52 of the heat pipe are permitted to bear against the lateral side of channel 42, the direct contact between the bottom part 56 and the base plate may be lost. Therefore, some care is needed in aligning these parts properly.

In FIG. 6, the bottom face of the channel 42 in the base plate 33 is flat, and the bottom part 56 is D-shaped in cross section with the flat side on the bottom of the base plate channel 42. This arrangement provides good surface contact over the area of flat bottom of the channel 42, and also provides relatively positive alignment. However the area of contact is somewhat less. In FIG. 6, like in FIGS. 5 and 7, the clamp-receiving structure is a channel 46, whereas in FIG. 8 the corresponding structure is a ridge 47.

FIGS. 7 and 8 show that the manufacturing ease and very limited expense aspects of the base plate 33 are also achieved if the bottom part of the U-shaped heat pipe resides below the base plate and thus in direct contact with the heat source 70 as in FIG. 4. The embodiment of FIG. 7 is particularly efficient for thermal energy transfer. The flat D-shaped bottom of the bottom part 56 of the heat pipe is in direct contact with the source and the rounded remaining walls of part 56 are in direct contact with the base plate 33. This provides even more intimate thermally conductive contact with the heat source and is relatively more easily aligned then the round contour in FIG. 5 because the flat bottom in FIG. 7 is aligned when flush with the underside of base plate 33.

FIG. 8 provides further alignment benefits in a lozenge-shaped cross sectional evaporator as the bottom part 56 of a U-shaped heat pipe. This structure provides reasonably full surface contact together with positive positioning because the opposite sides of the lozenge shaped bottom part 56 are parallel and are pressed into contact with the base plate and the heat source on opposite sides.

The ridge 47 for engaging with the spring clip or clamp 62 (see also FIG. 4) functions in the same way as the channel shaped version 46 in FIGS. 5–7. The spring clip or clamp has a portion that engages over and laterally beyond an edge formed by the side wall of channel 46 or ridge 47 to clamp the base plate in place.

In each of the embodiments, the heat pipe can be press fit into receptacle channel 42 in the base plate 33. A solder or thermally conductive resin or potting formulation can fill any spaces between the material of the base plate and that of the heat pipe. The bottom sides of the base plate 33 and the facing surfaces of the bottom part 56 of the heat pipe, particularly in the arrangements where a flat surface is flush and exposed for contact with the heat source, the respective surface can be treated to enhance thermal conductivity. For example, the flat surfaces of the evaporator part 56 can be fly-cut so as to be flat and smooth, for example to a local dimensional tolerance of 0.001", and thus complement a flat and incompressible circuit package surface. Alternatively, if the circuit passage is compressible, the evaporator surface can be roughened or patterned to increase the surface area of contact.

In the embodiments of FIGS. 1 and 3, the standing legs 52 of each heat pipe are spaced by less than the corresponding dimension of the base plate 33. This arrangement is generally compact because the standing legs are advantageously spaced from the edges of the fins 44, and the fins can be the same width and length as the base plate, forming a compact shape. In the embodiments of FIGS. 7 and 8, the standing legs 52 are spaced more widely than the base plate and straddle the base plate. The base plate in that case is narrower than the fins, assuming that the standing legs 52 are straight and aligned normal to the plane of the base plate 33. However it is also possible to provide other shapes besides the strictly squared U-shape with perpendicular bottom and side parts 56, 52, for example having additional bends or inclined parts.

For best thermal efficiency, the contact between all heat transfer surfaces along the path of transfer of heat energy is as intimate as reasonably possible. In addition to maximizing contact area, the wall of the heat pipe should be thin and constructed of a thermally conductive metal or like material.

An advantage of the invention is that in addition to functioning as structural columns, the use of several heat pipes of relatively smaller diameter produces greater surface area per unit volume than a single larger diameter structure (or perhaps a smaller number, such as two columns instead of four. As a result, there is a comparable heat transfer efficiency achieved in a smaller heat pipe volume.

An important advantage of the invention is that the parts are few, very inexpensive and inexpensively assembled. Particularly in the arrangements with the evaporator tube exposed for contact, the thermal energy transfer efficiency is very good. These advantages, including minimized expense and maximized thermal efficiency, can be achieved in a range of structures having the attributes discussed herein. Instead of having two dual heat pipes, it is possible to have more or fewer. The individual heat pipes need not be U-shaped. For example the heat pipes could be L-shaped, with a bottom length received in the base plate and a single column at one side. Other arrangements with round or non-round cross sections (e.g., polygonal cross sections) can be used. The tubes can be snap-fitted into the base plate by using suitable dimensional relationships.

The materials and other internal arrangements of the heat pipe can otherwise incorporate a number of the aspects of known heat pipes. The heat pipe vessel(s) form an envelope containing a working fluid, and could be oriented for gravity return of condensed fluid to the evaporator, but preferably have a wicking material along the inside walls so as to return the condensed fluid by capillary action without regard to orientation. The wick can be structured as sintered particles, fibers or the like, adhered to the inside surfaces of the walls of the vessel. The vessel is vacuum tight and may be formed from a sealed tube of thermally conductive material, e.g., aluminum, copper, titanium alloy, tungsten, etc. Although shown as substantially tubular or tubular with flattened surfaces for contact with the heat source, the heat pipe vessels can take other shapes.

The working thermal transfer fluid can be selected from a variety of well known two phase fluids depending upon expected operational conditions such as the operating temperature range over which the heat transfer device will operate. Appropriate fluids may include, for example, one or more of water, Freon, ammonia, acetone, methanol, ethanol and the like. The prime requirements for a suitable working fluid are compatibility with the materials forming wick and the envelope wall, good thermal stability, ease of wetting of the wick and wall materials as well as viscosity and surface tension attributes suitable for capillary flow.

The working fluid can be charged into the heat pipe vessels before or after the assembly with the base plate and heat transfer fins, because the arrangement is characterized by access to the heat pipe vessel after assembly, at least at an end located at the uppermost fin. In that case, the vessel is first shaped and attached, but is unsealed at a limited venting point for charging. The working fluid is added, e.g., after partially evacuating the air in the vessel. The charging passage is plugged by adhesive, soldering and/or crimping operations.

The pressure and working fluid charge are arranged to obtain an operating vapor pressure in the vessel over the working temperature range, within vapor pressure limits that permit evaporation and condensation to occur at different points in the vessel (i.e., at the evaporator and condenser parts) when maintained at design temperature differences. For optimal results, at all points within the temperature range, the working fluid has advantageous characteristics including high latent heat storage capacity, high thermal conductivity, low liquid and vapor viscosities, high surface tension and an acceptable freezing or pour point. Preferably, the quantity of working fluid in the vessel is at least enough to saturate any wick material provided, or to support a gravity flow in a circulating manner in the absence of a wick.

In a preferred arrangement, the heat pipe vessel comprises one or more metals such as silver, gold, copper, aluminum, titanium or their alloys. Polymeric materials are also useful, including materials known in the electronics industry for heat transfer applications, such as thermoplastics (crystalline or non-crystalline, cross-linked or non-cross-linked), thermosetting resins, elastomers or blends or composites thereof. Some illustrative examples of useful thermoplastic polymers include, without limitation, polyolefins, such as polyethylene or polypropylene, copolymers (including terpolymers, etc.) of olefins such as ethylene and propylene, with each other and with other monomers such as vinyl esters, acids or esters of unsaturated organic acids or mixtures thereof, halogenated vinyl or vinylidene polymers such as polyvinyl chloride, polyvinylidene chloride, polyvinyl fluoride, polyvinylidene fluoride and copolymers of these monomers with each other or with other unsaturated monomers, polyesters, such as poly(hexamethylene adipate or sebacate), poly(ethylene terephthalate) and poly(tetramethylene terephthalate), polyamides such as Nylon-6, Nylon-6,6, Nylon-6,10, Versamids, polystyrene, polyacrylonitrile, thermoplastic silicone resins, thermoplastic polyethers, thermoplastic modified cellulose, polysulphones and the like.

Examples of some useful elastomeric resins for potting and adhesive aspects include, without limitation, elastomeric gums and thermoplastic elastomers, natural or synthetic. The term "elastomeric gum", refers to polymers which are noncrystalline and which exhibit after cross-linking rubbery or elastomeric characteristics. The term "thermoplastic elastomer" refers to materials which exhibit, in various temperature ranges, at least some elastomer properties. Such materials generally contain thermoplastic and elastomeric moieties. For purposes of this invention, the elastomer resin can be cross-linked or not cross-linked when used in the inventive compositions.

Illustrative examples of some suitable elastomeric gums for use in this invention include, without limitation, polyisoprene (both natural and synthetic), ethylene-propylene random copolymers, poly(isobutylene), styrene-butadiene random copolymer rubbers, styrene-acrylonitrile-butadiene terpolymer rubbers with and without added copolymerized amounts of unsaturated carboxylic acids, polyacrylate rubbers, polyurethane gums, random copolymers of vinylidene fluoride and, for example, hexafluoropropylene, polychloroprene, chlorinated polyethylene, chlorosulphonated polyethylene, polyethers, plasticized poly(vinyl chloride), substantially non-crystalline random co—or ter-polymers of ethylene with vinyl esters or acids and esters of unsaturated acids, silicone gums and base polymers, for example, poly(dimethyl siloxane), poly(methylphenyl siloxane) and poly(dimethyl vinyl siloxanes).

Some illustrative examples of thermoplastic elastomers suitable for use in the invention include, without limitation, graft and block copolymers, such as random copolymers of ethylene and propylene grafted with polyethylene or polypropylene side chains, and block copolymers of —olefins such as polyethylene or polypropylene with ethylene/propylene or ethylene/propylene/diene rubbers, polystyrene with polybutadiene, polystyrene with polyisoprene, polystyrene with ethylene-propylene rubber, poly(vinylcyclohexane) with ethylene-propylene rubber, poly(—methylstyrene) with polysiloxanes, polycarbonates with polysiloxanes, poly(tetramethylene terephthalate) with poly(tetramethylene oxide) and thermoplastic polyurethane rubbers.

Examples of some thermosetting resins useful herein include, without limitation, epoxy resins, such as resins made from epichlorohydrin and bisphenol A or epichlorohydrin and aliphatic polyols, such as glycerol, and which can be conventionally cured using amine or amide curing agents. Other examples include phenolic resins obtained by condensing a phenol with an aldehyde, e.g., phenol-formaldehyde resin. Other additives can also be present in the composition, including for example fillers, pigments, antioxidants, fire retardants, cross-linking agents, adjuvants and the like.

It is to be understood that the invention is not limited only to the particular constructions herein disclosed and shown in the drawings, but also encompasses modifications or equivalents within the scope of the appended claims.

What is claimed is:

1. A heat transfer device for dissipating heat from a heat source, said device comprising:
   a heat pipe including a vessel to be placed in thermally conductive relation to said heat source, said heat pipe comprising thermally conductive material at least at an elongated and flattened evaporator part and including a condenser part that is in fluid communication with said flattened evaporator part;
   a heat transfer medium for movement in a cycle between said evaporator part and said condenser part;
   a wicking material within said heat pipe that is capable of supporting a capillary flow of said heat transfer medium at least for part of said cycle;
   a base plate for at least partly supporting said heat pipe, said base plate having a surface to be directed toward said heat source, wherein said base plate has at least one channel extending across a full length of said surface of said base plate, wherein said channel is dimensioned to receive at least a portion of said elongated and flattened evaporator part of said heat pipe and said flattened evaporator part is disposed in said channel and extends substantially parallel to a plane of said base plate, so as to engage said heat source.

2. A heat transfer device according to 1 wherein said condenser part comprises an integral extension of said evaporator part.

3. A heat transfer device according to 2 wherein said condenser part extends perpendicular to said plane of said base plate.

4. A heat transfer device according to 3 further comprising an array of air heat exchange structures coupled to said condenser part.

5. A heat transfer device according to 4 wherein said air heat exchange structures comprise an array of fins.

6. A heat transfer device according to 5 wherein said fins comprise substantially parallel plates.

7. A heat transfer device according to 6 wherein said fins comprise an array of plates that are shaped by at least one of folding, rolling, corrugation, and surface irregularity.

8. A heat transfer device according to 2 wherein said base plate comprises a plurality of parallel channels coupled to a plurality of said evaporator parts.

9. A heat transfer device according to 2 wherein said heat transfer medium is a fluid.

10. A heat transfer device according to 2 wherein said heat pipe is U-shaped with said elongated and flattened evaporator part forming a bottom portion of said U-shaped heat pipe, and further wherein said elongated and flattened evaporator part is positioned in a plane perpendicular to said base plate so as to be received within said channel.

11. A heat transfer device according to 10 wherein said elongated and flattened evaporator part of said U-shape has at least one surface that is complementary with a surface of said channel.

12. A heat transfer device according to 11 wherein said elongated and flattened evaporator part has at least one flattened side surface that is complementary to said surface of said channel.

13. A heat transfer device according to 2 wherein at least one said channel is defined in a surface of said base plate facing said heat source.

14. A heat transfer device according to 2 wherein said at least one channel defined in a surface of said base plate facing away from said heat source.

15. A heat transfer device according to 2 comprising at least one of a ridge and a channel defined in a surface of said base plate and facing away from said heat source.

16. A heat transfer device according to 2 further comprising a structure for engaging a clamp for holding said base plate against said heat source, said structure for engaging said clamp comprising at least one of a ridge and an additional channel extending parallel to said channel extending across a full length of a surface of said base plate.

17. A heat transfer device according to 2 wherein said heat transfer medium is provided to cyclically undergo a phase change from liquid to vapor at said evaporator and from vapor to liquid at said condensers.

18. A heat transfer device for dissipating heat from a heat source, said device comprising:
  a heat pipe including a vessel to be placed in thermally conductive relation to said heat source, said heat pipe comprising thermally conductive material at least at an elongated and at least partially flattened evaporator part;
  a plurality of condenser parts that are each in fluid communication with said evaporator part;
  a heat transfer medium for movement in a cycle between said evaporator and said condensers;
  a wicking material within said heat pipe that is capable of supporting a capillary flow of said heat transfer medium at least for part of said cycle;
  a base plate for at least partly supporting said heat pipe, said base plate having a surface to be directed toward said heat source, wherein said base plate has at least one channel extending across a full length of a surface of said base plate, wherein said channel is dimensioned to receive within its length said elongated and flattened evaporator part of said heat pipe so that said elongated and flattened evaporator part engages said heat source.

19. A heat transfer according to 18 wherein said condenser parts are substantially parallel to each other.

20. A heat transfer according to 18 wherein said condenser parts comprise an integral extension of said evaporator part.

21. A heat transfer according to 20 wherein said condenser parts are substantially perpendicular to said flattened evaporator part.

22. A heat transfer device according to 21 further comprising an array of air heat exchange structures coupled to at least one of said condenser parts of said heat pipe, and wherein said air heat exchange structures are supported by said condenser part of said heat pipe.

* * * * *